United States Patent
Cheng et al.

(10) Patent No.: US 10,675,657 B2
(45) Date of Patent: Jun. 9, 2020

(54) OPTICAL ELEMENTS AND METHOD FOR FABRICATING THE SAME

(71) Applicant: VisEra Technologies Company Limited, Hsin-Chu (TW)

(72) Inventors: Sheng-Chuan Cheng, Hsin-Chu (TW); Huang-Jen Chen, Keelung (TW); Chi-Han Lin, Zhubei (TW); Han-Lin Wu, Hsin-Chu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 0 days.

(21) Appl. No.: 16/031,277

(22) Filed: Jul. 10, 2018

(65) Prior Publication Data
US 2020/0016628 A1    Jan. 16, 2020

(51) Int. Cl.
| | |
|---|---|
| *B05D 3/10* | (2006.01) |
| *B05D 5/06* | (2006.01) |
| *B05D 7/00* | (2006.01) |
| *G02B 5/20* | (2006.01) |
| *H01L 21/04* | (2006.01) |
| *H01L 21/28* | (2006.01) |
| *H01L 21/306* | (2006.01) |
| *H01L 21/3065* | (2006.01) |

(Continued)

(52) U.S. Cl.
CPC .............. *B05D 5/06* (2013.01); *B05D 3/107* (2013.01); *B05D 7/14* (2013.01); *B05D 7/5483* (2013.01); *H01L 21/0475* (2013.01); *H01L 21/28* (2013.01); *H01L 21/3065* (2013.01); *H01L 21/30604* (2013.01); *H01L 21/311* (2013.01); *G02B 5/201* (2013.01)

(58) Field of Classification Search
None
See application file for complete search history.

(56) References Cited

U.S. PATENT DOCUMENTS

| | | | |
|---|---|---|---|
| 7,588,879 B2 * | 9/2009 | Brodsky | G03F 7/091 430/271.1 |
| 2004/0256357 A1 * | 12/2004 | Edelberg | G03F 7/427 216/67 |

(Continued)

FOREIGN PATENT DOCUMENTS

| | | |
|---|---|---|
| JP | 2002311237 A | 10/2002 |
| JP | 2015156381 A | 8/2015 |

OTHER PUBLICATIONS

Japanese Office Action of its corresponding JP application No. 2018-216555 dated Oct. 1, 2019; pp. 1-3.

*Primary Examiner* — Stephanie P Duclair
(74) *Attorney, Agent, or Firm* — Muncy, Geissler, Olds & Lowe, P.C.

(57) ABSTRACT

A method for fabricating an optical element is provided. The fabrication method includes the following steps. A substrate is provided. A plurality of metal grids are formed on the substrate. A first organic layer is formed on the substrate between the plurality of metal grids. A second organic layer is formed on the first organic layer and the plurality of metal grids. The second organic layer and the first organic layer are etched to leave the plurality of metal grids and a plurality of patterned second organic layers on the plurality of metal grids. An optical element fabricated by the method is also provided.

13 Claims, 16 Drawing Sheets

(51) Int. Cl.
*H01L 21/311* (2006.01)
*B05D 7/14* (2006.01)

(56) References Cited

U.S. PATENT DOCUMENTS

2005/0153538 A1* 7/2005 Tsai .................. H01L 21/31116
 438/636
2006/0255315 A1* 11/2006 Yellowaga ........... C11D 3/2082
 252/79.1
2012/0225388 A1* 9/2012 Umatate ........... H01L 21/31144
 430/322

* cited by examiner

OPTICAL ELEMENTS AND METHOD FOR FABRICATING THE SAME

BACKGROUND OF THE INVENTION

Field of the Invention

The invention relates to a fabrication method of an optical element, and more particularly to a fabrication method of an optical element using a two-step wave-guiding process, and an optical element fabricated thereby.

Description of the Related Art

In a conventional process for fabricating a wave-guiding structure, after metal grids are formed on a substrate, a guiding film is coated over the metal grids and the substrate. A mask layer is then formed on the guiding film. An etching process is performed on the guiding film until the substrate is exposed. Since the conditions (e.g. gas type and etching time) of the etching process are hard to control properly, the substrate often suffers from being damaged during the etching process.

Therefore, development of a simple fabrication method of an optical element which is capable of preventing damage to the substrate during the etching process is desirable.

BRIEF SUMMARY OF THE INVENTION

In accordance with one embodiment of the invention, a method for fabricating an optical element is provided. The fabrication method comprises the following steps. A substrate is provided. A plurality of metal grids having sidewalls is formed on the substrate. A first organic layer is formed on the substrate between the plurality of metal grids. A second organic layer is formed on the first organic layer and the plurality of metal grids. The second organic layer and the first organic layer are etched to leave the plurality of metal grids and a plurality of patterned second organic layers formed on the plurality of metal grids.

In some embodiments, the second organic layer is etched by a first etching process which uses haloalkyl gas as an etching gas.

In some embodiments, the first organic layer is etched by a second etching process which uses oxygen, carbon dioxide or nitrogen as an etching gas.

In some embodiments, a part of the first organic layer is left on the sidewalls of the plurality of metal grids after the second etching process.

In some embodiments, the first organic layer left on the sidewalls of the plurality of metal grids is removed by soaking in solvent or a third etching process.

In some embodiments, the third etching process uses oxygen, carbon dioxide or nitrogen as an etching gas.

In some embodiments, the second organic layer and the first organic layer are etched by a fourth etching process which uses haloalkyl gas as an etching gas to leave a part of the first organic layer between the plurality of metal grids.

In some embodiments, the first organic layer between the plurality of metal grids is removed by soaking in solvent.

In some embodiments, the fabrication method further comprises a step in which the first organic layer is patterned before the second organic layer is formed.

In some embodiments, the fabrication method further comprises a step in which color filters are formed on the substrate between the plurality of metal grids and between the plurality of patterned second organic layers.

In some embodiments, the first organic layer has a refractive index which is in a range from about 1.4 to about 1.55.

In some embodiments, the second organic layer has a refractive index which is in a range from about 1.2 to about 1.45.

In accordance with one embodiment of the invention, an optical element is provided. The optical element comprises a substrate, a plurality of metal grids having a width, a height and sidewalls, an oxide layer, and a plurality of organic layers having a width and sidewalls. The plurality of metal grids are formed on the substrate. The oxide layer is formed on the substrate between the plurality of metal grids. The plurality of organic layers are formed on the plurality of metal grids. The width of the organic layer is greater than that of the metal grid. There is a gap having a height and a width between the organic layer and the oxide layer.

In some embodiments, the organic layer has a refractive index which is in a range from about 1.2 to about 1.45.

In some embodiments, the height of the gap is defined as the distance between the organic layer and the oxide layer, which is greater than zero and less than or equal to the height of the metal grid.

In some embodiments, the width of the gap is defined as the distance between the sidewall of the metal grid and that of the organic layer, which is greater than zero and less than or equal to the difference between the width of the organic layer and that of the metal grid.

In some embodiments, the optical element further comprises a buffer layer filled into the gap.

In some embodiments, the buffer layer has a refractive index which is in a range from about 1.4 to about 1.55.

In the present invention, it is not required that a microlens (ML) structure be disposed over the color filters. Light is conducted into photodiode (PD) areas through a wave-guiding element which is fabricated on metal grids. The present invention provides a two-step process for fabricating a wave-guiding structure. A first organic layer (refractive index: about 1.4 to about 1.55) is first formed between the metal grids. The first organic layer is used as a buffer layer for a subsequent etching process. A second organic layer (refractive index: about 1.2 to about 1.45) is then formed on the first organic layer and the metal grids. The second organic layer is used to form the wave-guiding element. When a first etching process is performed using, for example, haloalkyl gas as an etching gas, the second organic layer is etched but the first organic layer is left. The remaining first organic layer is then removed by a second etching process using, for example, oxygen (which has a strong ability for lateral etching) as an etching gas, or the remaining first organic layer is removed by soaking it in solvent. Using such a technique can effectively prevent damage to the oxide layer on the substrate during the etching process.

In addition, in some embodiments, before the second organic layer is formed, the first organic layer is patterned by, for example, a reflow process to flatten the top surface of the first organic layer, which avoids the first organic layer remaining on the metal grid, improving wave-guiding effect. Furthermore, the optical performance, for example, QE profile of the present structure designs (e.g. forming a gap with specific dimensions underneath the wave-guiding element and located on both sides of the metal grid; filling the buffer layer into the gap) is no worse than the conventional wave-guiding structure without an ML structure.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
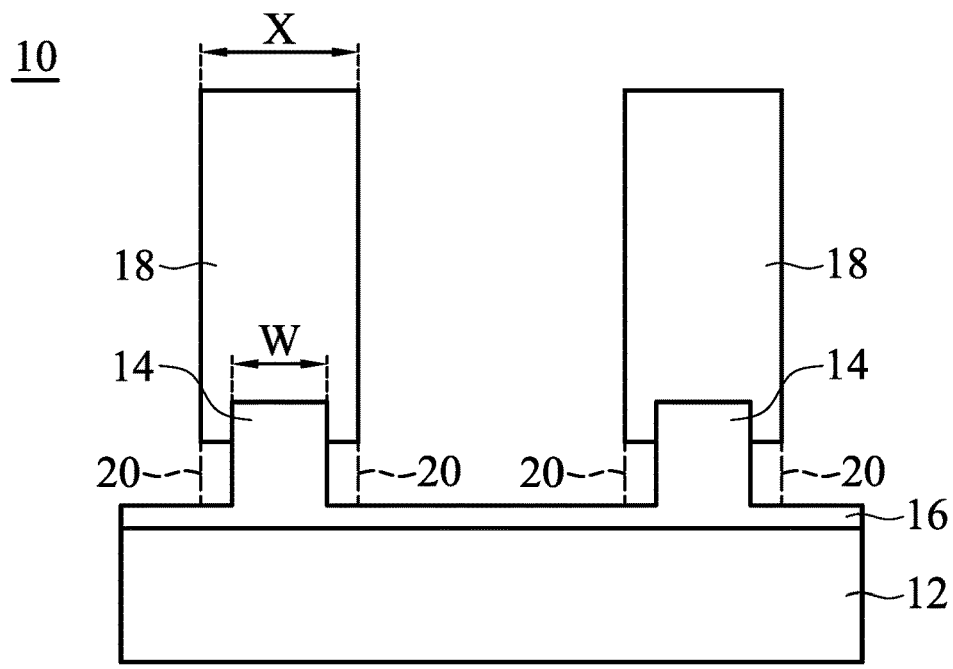
FIG. 1 is a cross-sectional view of an optical element in accordance with one embodiment of the invention.

Referring to FIG. 1, in accordance with one embodiment of the invention, an optical element 10 is provided. FIG. 1 shows a cross-sectional view of the optical element 10.

The optical element 10 comprises a substrate 12, a plurality of metal grids 14, an oxide layer 16, and a plurality of organic layers 18. The plurality of metal grids 14 are formed on the substrate 12. The oxide layer 16 is formed on the substrate 12 between the plurality of metal grids 14. The plurality of organic layers 18 are formed on the plurality of metal grids 14. The width X of the organic layer 18 is greater than the width W of the metal grid 14. Specifically, a gap 20 is formed between the organic layer 18 and the oxide layer 16.

In some embodiments, the organic layer 18 may comprise any suitable low-refractive-index organic materials with a refractive index which is in a range from about 1.2 to about 1.45.

Figure 1A:
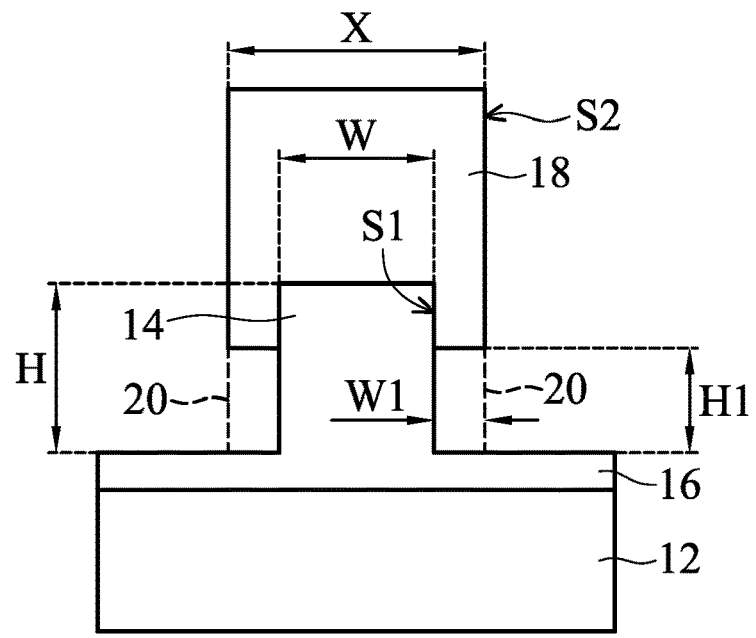
FIG. 1A is a cross-sectional view of an optical element in accordance with one embodiment of the invention.

The dimensions of the gap 20 formed between the organic layer 18 and the oxide layer 16 are described in detail in FIG. 1A.

As shown in FIG. 1A, the height H1 of the gap 20 is defined as the distance between the organic layer 18 and the oxide layer 16.

In some embodiments, the height H1 of the gap 20 is greater than zero and less than or equal to the height H of the metal grid 14.

In addition, the width W1 of the gap 20 is defined as the distance between the sidewall S1 of the metal grid 14 and the sidewall S2 of the organic layer 18.

In some embodiments, the width W1 of the gap 20 is greater than zero and less than or equal to the difference between the width X of the organic layer 18 and the width W of the metal grid 14.

In some embodiments, the organic layer 18 covers a part of the sidewall S1 of the metal grid 14, and at least a part of the sidewall S1 of the metal grid 14 is exposed from the organic layer 18.

Figure 2:
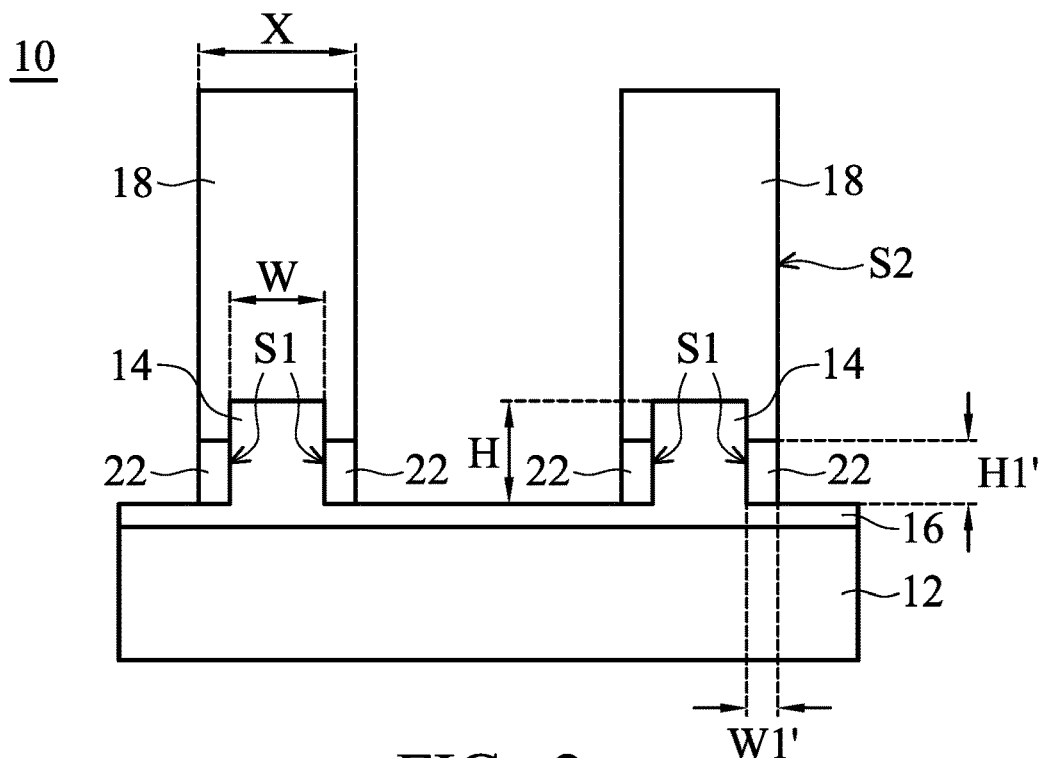
FIG. 2 is a cross-sectional view of an optical element in accordance with one embodiment of the invention.

Referring to FIG. 2, in accordance with one embodiment of the invention, an optical element 10 is provided. FIG. 2 shows a cross-sectional view of the optical element 10.

The optical element 10 comprises a substrate 12, a plurality of metal grids 14, an oxide layer 16, and a plurality of organic layers 18. The plurality of metal grids 14 are formed on the substrate 12. The oxide layer 16 is formed on the substrate 12 between the plurality of metal grids 14. The plurality of organic layers 18 are formed on the plurality of metal grids 14. The width X of the organic layer 18 is greater than the width W of the metal grid 14. Specifically, a buffer layer 22 is formed between the organic layer 18 and the oxide layer 16 and on the sidewall S1 of the metal grid 14.

In some embodiments, the organic layer 18 may comprise any suitable low-refractive-index organic materials with a refractive index which is in a range from about 1.2 to about 1.45.

In some embodiments, the buffer layer 22 may comprise any suitable organic material with a refractive index which is in a range from about 1.4 to about 1.55.

In some embodiments, the material of the organic layer 18 and the buffer layer 22 may be the same or different.

The dimensions of the buffer layer 22 which is formed between the organic layer 18 and the oxide layer 16 and on the sidewall S1 of the metal grid 14 are described in detail as follows.

As shown in FIG. 2, the height H1' of the buffer layer 22 is greater than zero and less than or equal to the height H of the metal grid 14.

The width W1' of the buffer layer 22 is greater than zero and less than or equal to the difference between the width X of the organic layer 18 and the width W of the metal grid 14.

In some embodiments, the organic layer 18 covers a part of the sidewall S1 of the metal grid 14, and at least a part of the buffer layer 22 is formed between the organic layer 18 and the oxide layer 16 and on the sidewall S1 of the metal grid 14.

Referring to FIGS. 3A-3G, in accordance with one embodiment of the invention, a method for fabricating the optical element 10 of FIG. 1 is provided. FIGS. 3A-3G show cross-sectional views of the method for fabricating the optical element 10.

Figure 3A:
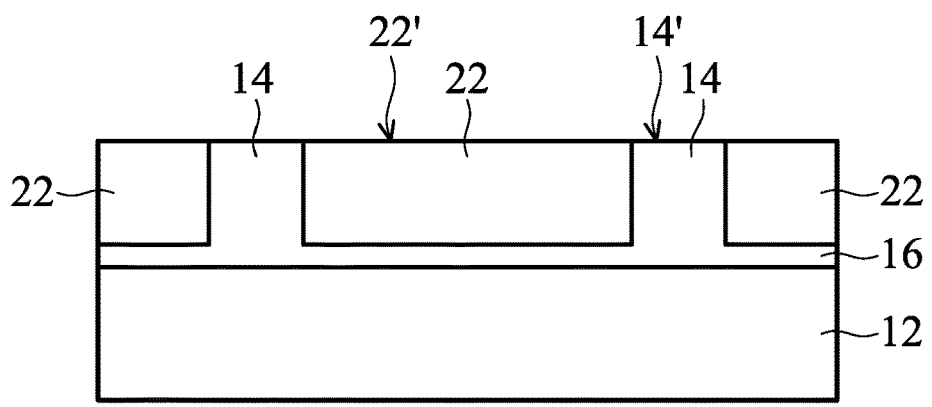
FIGS. 3A-3G are cross-sectional views of a method for fabricating an optical element in accordance with one embodiment of the invention.

Referring to FIG. 3A, a substrate 12 is provided. A plurality of metal grids 14 are formed on the substrate 12. An oxide layer 16 is formed on the substrate 12 between the plurality of metal grids 14. A first organic layer 22 is formed on the substrate 12 between the plurality of metal grids 14.

In some embodiments, the top surface 22' of the first organic layer 22 may be equal to or lower than the top surface 14' of the metal grid 14.

In some embodiments, the first organic layer 22 may comprise any suitable organic material with a refractive index (Re) which is in a range from about 1.4 to about 1.55.

Figure 3B:
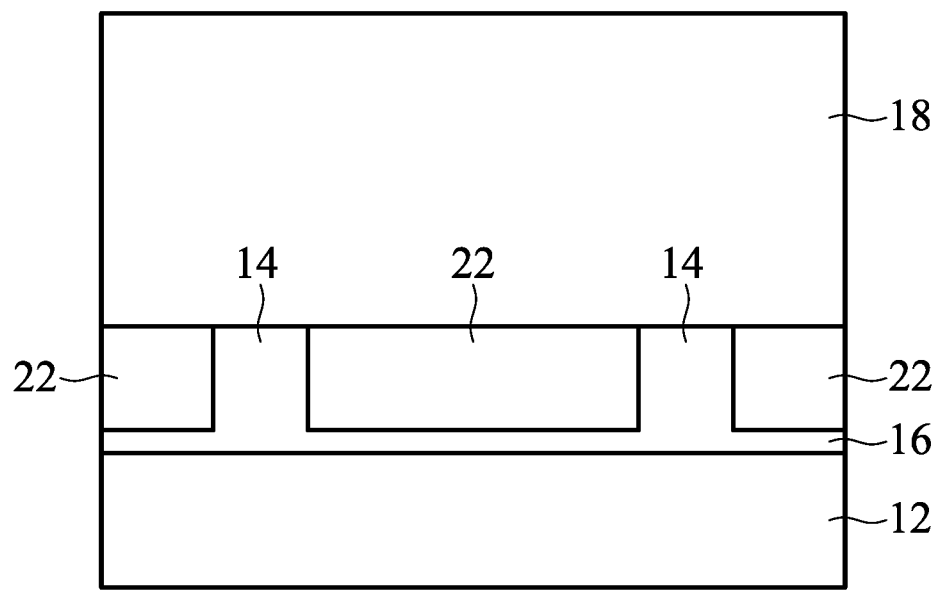

Next, referring to FIG. 3B, a second organic layer 18 is formed on the first organic layer 22 and the plurality of metal grids 14.

In some embodiments, the second organic layer 18 may comprise any suitable low-refractive-index organic materials with a refractive index which is in a range from about 1.2 to about 1.45.

In some embodiments, the second organic layer 18 may further comprise inorganic material such as titanium dioxide.

In some embodiments, the material of the second organic layer 18 and the first organic layer 22 may be the same or different.

Figure 3C:
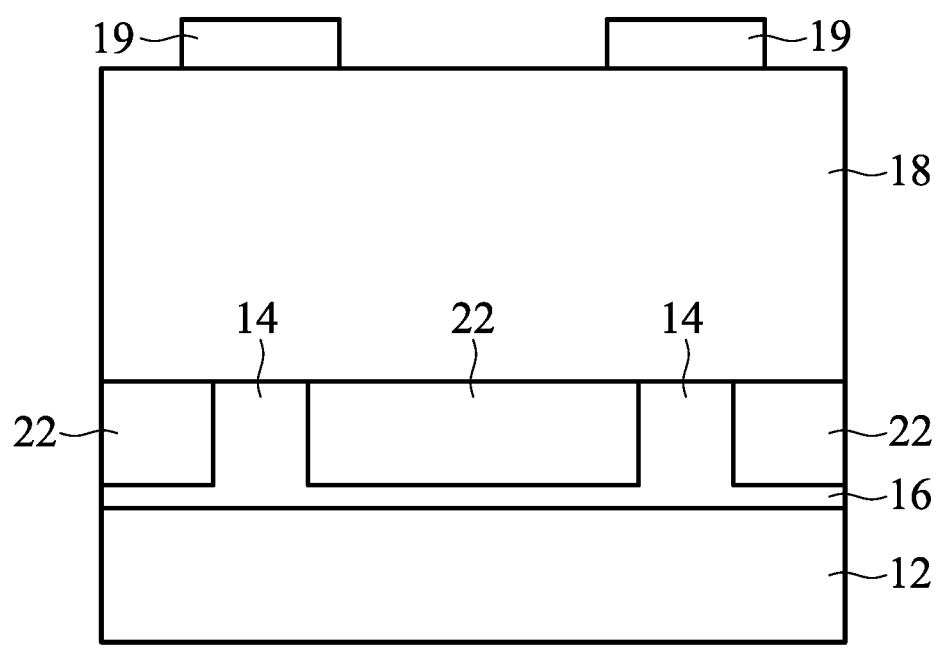

Next, referring to FIG. 3C, a patterned mask layer 19 is formed on the second organic layer 18 to define a subsequently formed wave-guiding structure.

Figure 3D:
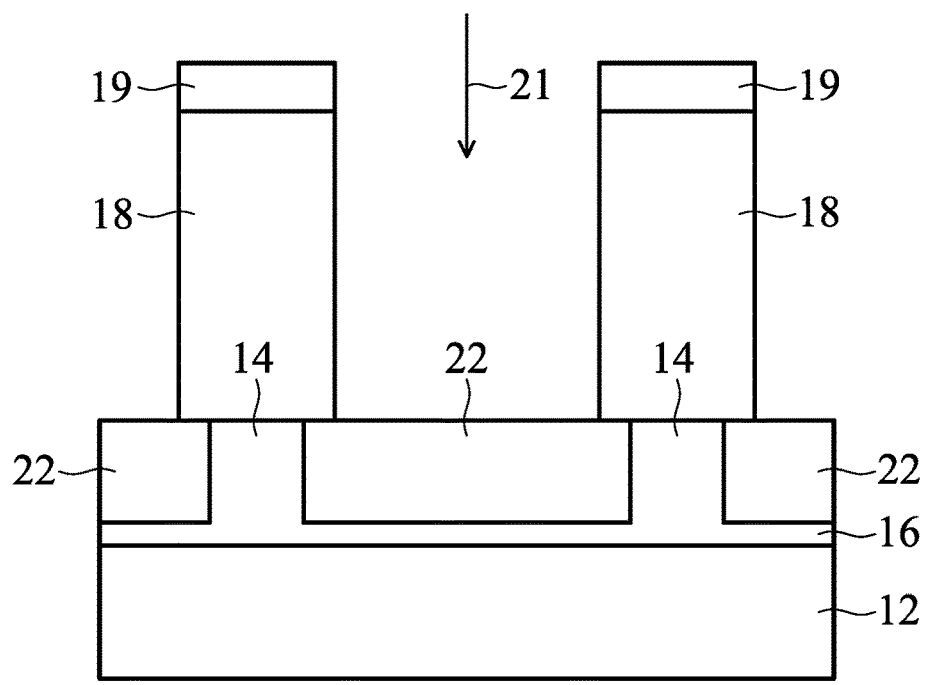

Next, referring to FIG. 3D, the second organic layer 18 is etched by a first etching process 21 using the patterned mask layer 19 as a mask to form a patterned second organic layer 18 (i.e. a wave-guiding structure).

In some embodiments, the etching gas of the first etching process 21 may be haloalkyl gas such as CF4, CHF3 or CH2F2.

In some embodiments, the second organic layer 18 is etched until the first organic layer 22 is exposed by optimally controlling the conditions, such as gas type, etching time, flow rate and etch selectivity, of the first etching process 21.

Figure 3E:
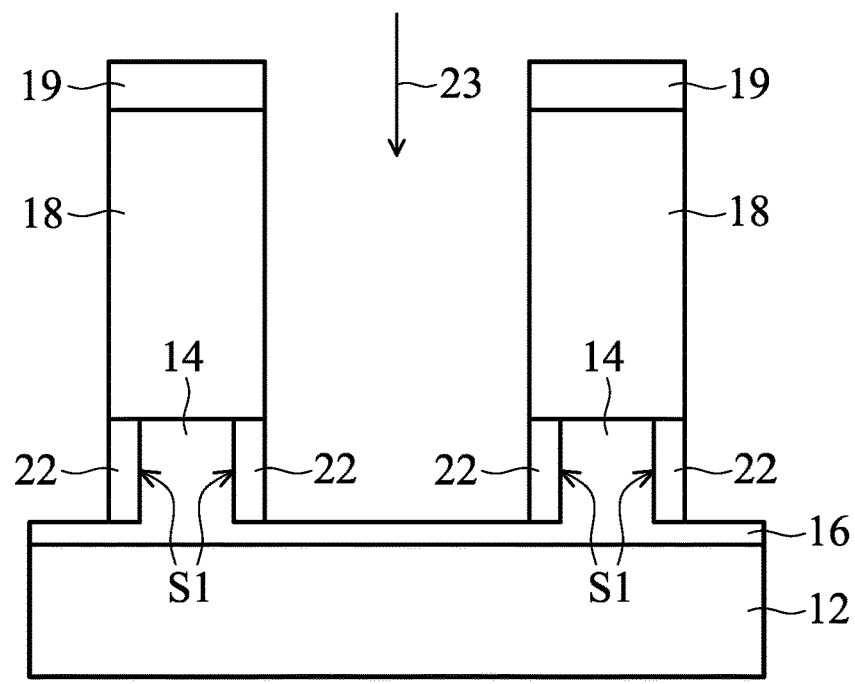

Next, referring to FIG. 3E, the first organic layer 22 is etched by a second etching process 23 using the patterned mask layer 19 as a mask. After the second etching process 23, a part of the first organic layer 22 is left on the sidewalls S1 of the plurality of metal grids 14.

In some embodiments, the etching gas of the second etching process 23 may be oxygen, carbon dioxide or nitrogen.

In some embodiments, the first organic layer 22 is etched to leave a part of the first organic layer 22 on the sidewalls S1 of the plurality of metal grids 14 by optimally controlling the conditions, such as gas type, etching time, flow rate and etch selectivity, of the second etching process 23.

Figure 3F:
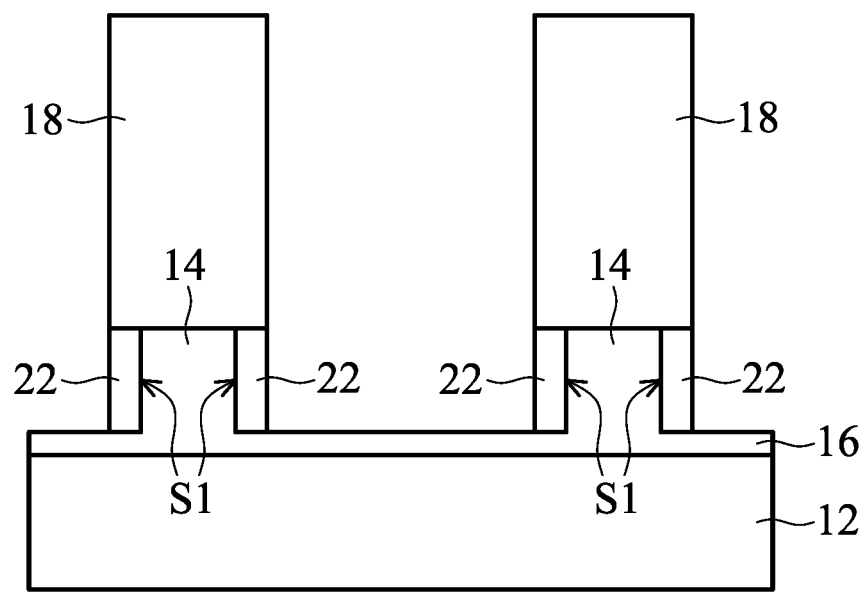

Next, referring to FIG. 3F, the patterned mask layer 19 is removed using any suitable method.

In some embodiments, the dimensions of the first organic layer 22 which is left between the second organic layer 18 and the oxide layer 16 and on the sidewall S1 of the metal grid 14 are described in detail in FIG. 2.

In some embodiments, the second organic layer 18 may further cover a part of the sidewall S1 of the metal grid 14, and at least a part of the first organic layer 22 is left between the second organic layer 18 and the oxide layer 16 and on the sidewall S1 of the metal grid 14.

Figure 3G:
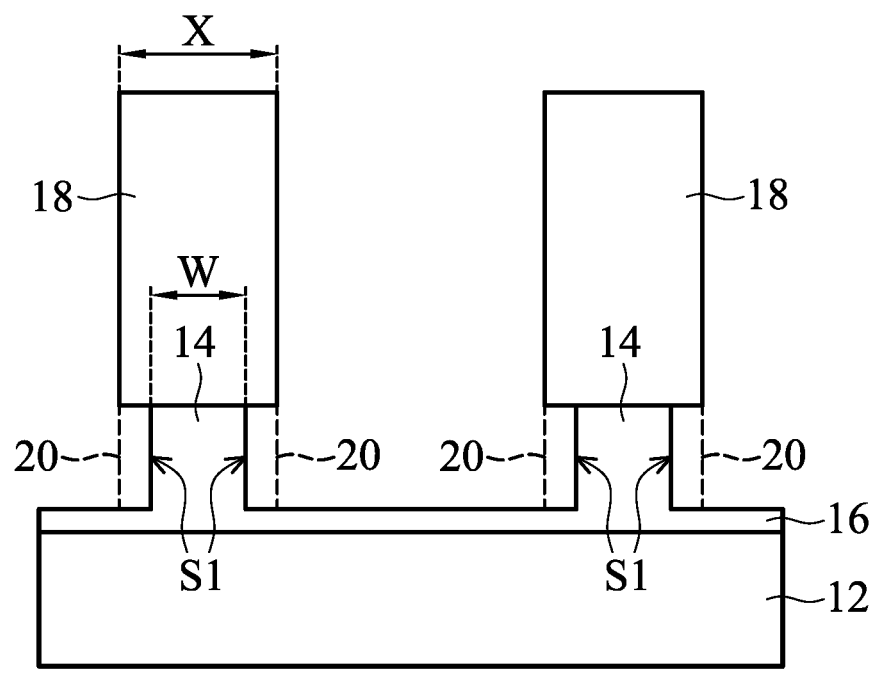

Next, referring to FIG. 3G, the first organic layer 22 left on the sidewalls S1 of the plurality of metal grids 14 is removed by soaking in solvent, and a gap 20 is formed between the second organic layer 18 and the oxide layer 16.

In some embodiments, the solvent used to remove the first organic layer 22 left on the sidewalls S1 of the plurality of metal grids 14 may comprise any suitable organic solvent.

In some embodiments, the width X of the second organic layer 18 is greater than the width W of the metal grid 14.

The dimensions of the gap 20 formed between the second organic layer 18 and the oxide layer 16 are described in detail in FIG. 1A.

In some embodiments, the second organic layer 18 may further cover a part of the sidewall S1 of the metal grid 14, and at least a part of the sidewall S1 of the metal grid 14 is exposed from the second organic layer 18.

Next, color filters, such as red, green or blue color filter (not shown), are formed on the substrate 20 between the plurality of metal grids 14 and between the plurality of patterned second organic layers 18.

Therefore, the optical element 10 having the plurality of metal grids 14 and the plurality of patterned second organic layers 18 formed on the plurality of metal grids 14 is formed.

Referring to FIGS. 4A-4G, in accordance with one embodiment of the invention, a method for fabricating the optical element 10 of FIG. 1 is provided. FIGS. 4A-4G show cross-sectional views of the method for fabricating the optical element 10.

Figure 4A:
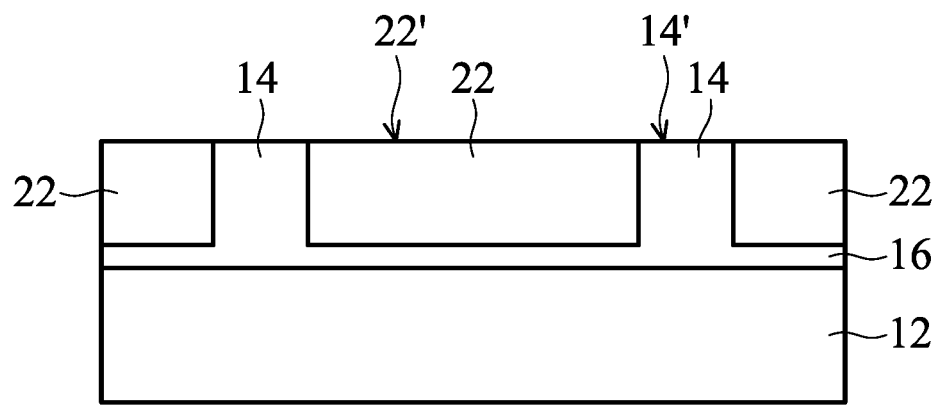
FIGS. 4A-4G are cross-sectional views of a method for fabricating an optical element in accordance with one embodiment of the invention.

Referring to FIG. 4A, a substrate 12 is provided. A plurality of metal grids 14 are formed on the substrate 12. An oxide layer 16 is formed on the substrate 12 between the plurality of metal grids 14. A first organic layer 22 is formed on the substrate 12 between the plurality of metal grids 14.

In some embodiments, the top surface 22' of the first organic layer 22 may be equal to or lower than the top surface 14' of the metal grid 14.

In some embodiments, the first organic layer 22 may comprise any suitable organic material with a refractive index (Re) which is in a range from about 1.4 to about 1.55.

Figure 4B:
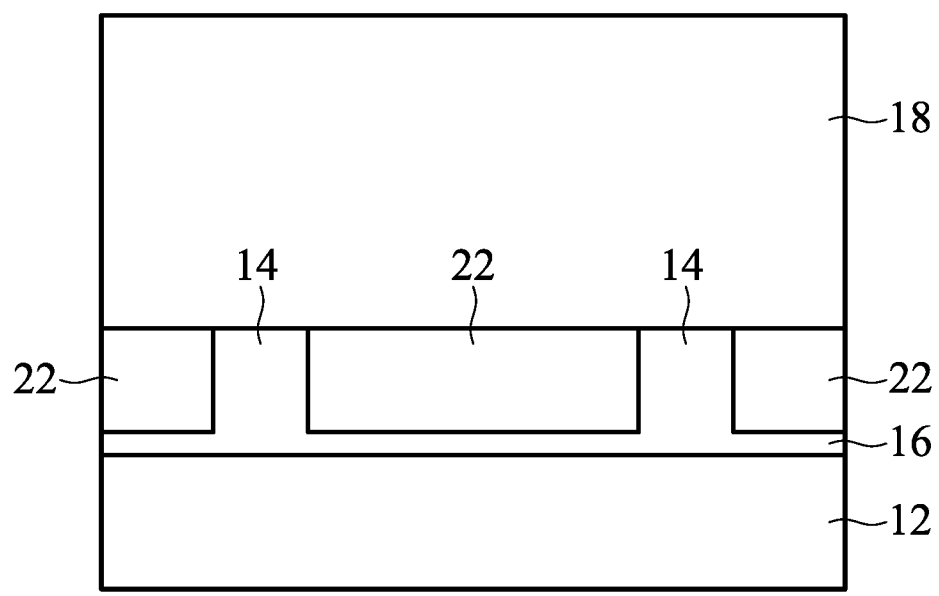

Next, referring to FIG. 4B, a second organic layer 18 is formed on the first organic layer 22 and the plurality of metal grids 14.

In some embodiments, the second organic layer 18 may comprise any suitable low-refractive-index organic materials with a refractive index which is in a range from about 1.2 to about 1.45.

In some embodiments, the second organic layer 18 may further comprise inorganic material such as titanium dioxide.

In some embodiments, the material of the second organic layer 18 and the first organic layer 22 may be the same or different.

Figure 4C:
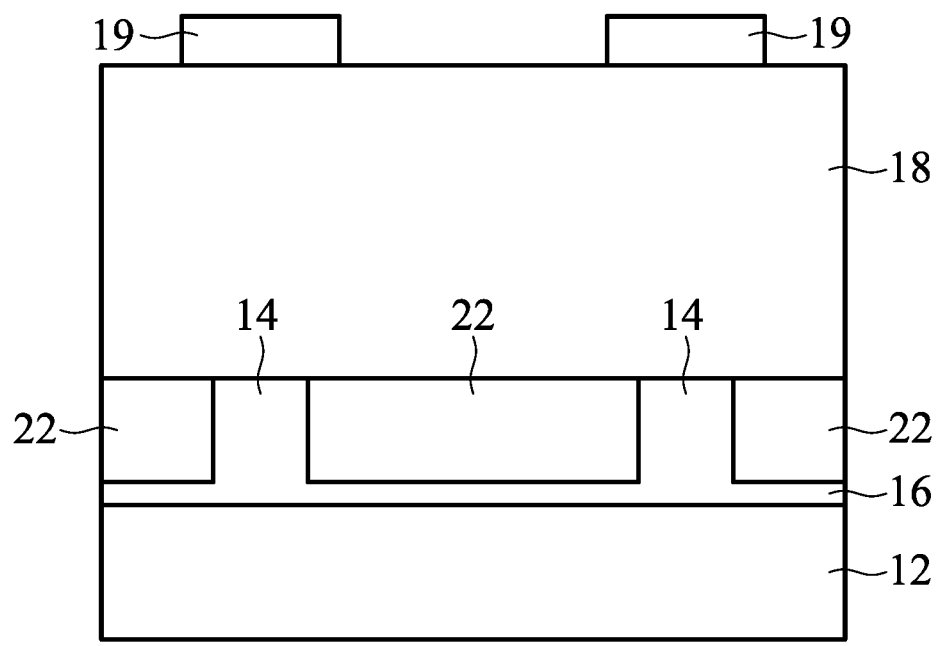

Next, referring to FIG. 4C, a patterned mask layer 19 is formed on the second organic layer 18 to define a subsequently formed wave-guiding structure.

Figure 4D:
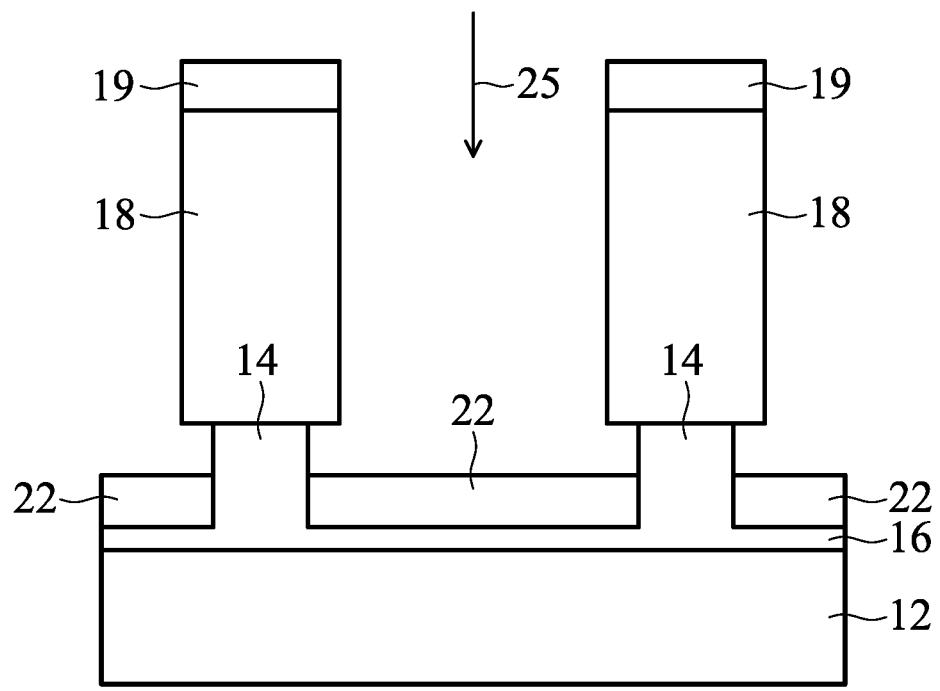

Next, referring to FIG. 4D, the second organic layer 18 and at least a part of the first organic layer 22 are etched by a fourth etching process 25 using the patterned mask layer 19 as a mask to form a patterned second organic layer 18 (i.e. a wave-guiding structure).

In some embodiments, the etching gas of the etching process 25 may be haloalkyl gas such as CF4, CHF3 or CH2F2.

In some embodiments, the second organic layer 18 and at least a part of the first organic layer 22 are etched to leave the first organic layer 22 with proper thickness between the plurality of metal grids 14 by optimally controlling the conditions, such as gas type, etching time, flow rate and etch selectivity, of the etching process 25.

Figure 4E:
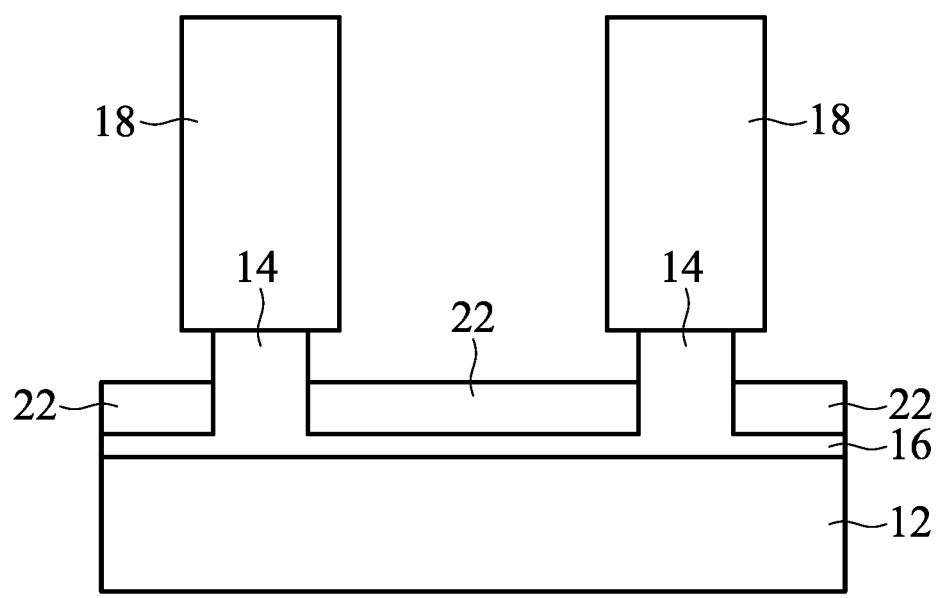

Next, referring to FIG. 4E, the patterned mask layer 19 is removed using any suitable method.

Figure 4F:
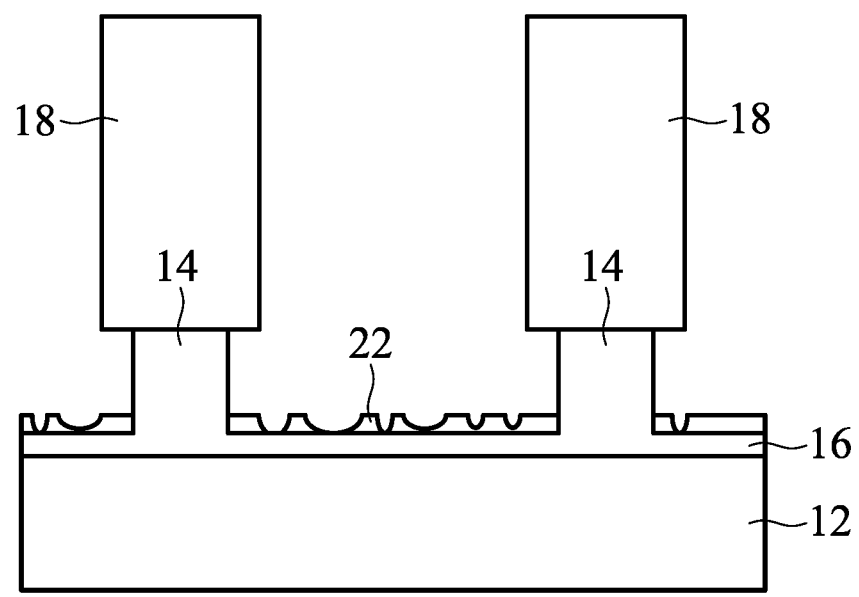

Next, referring to FIG. 4F, the first organic layer 22 left between the plurality of metal grids 14 is removed by soaking in solvent.

In some embodiments, the solvent used to remove the first organic layer 22 left between the plurality of metal grids 14 may comprise any suitable organic solvent.

Figure 4G:
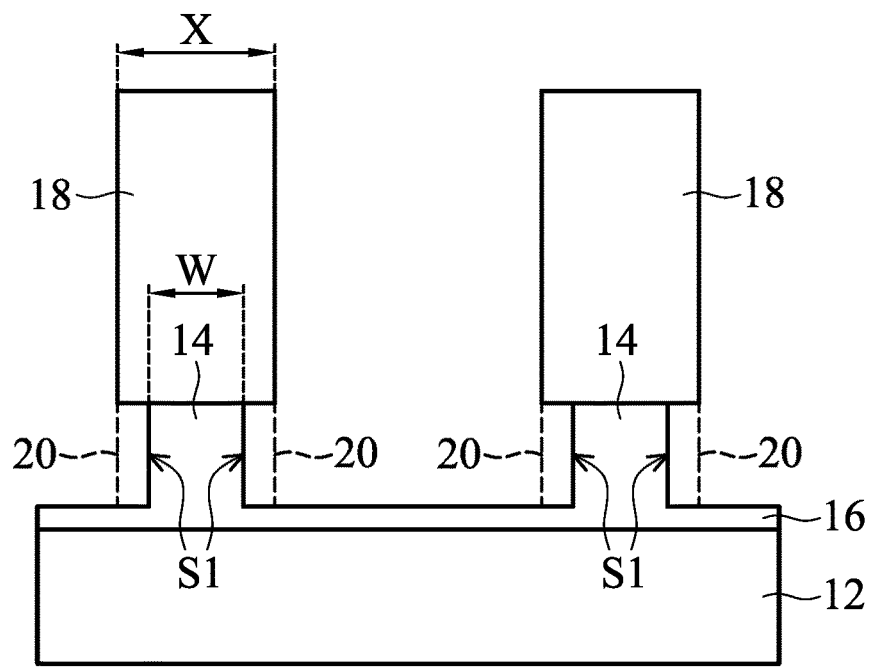

Next, referring to FIG. 4G, a surface descum process is performed, and a gap 20 is formed between the second organic layer 18 and the oxide layer 16.

In some embodiments, the width X of the second organic layer 18 is greater than the width W of the metal grid 14.

The dimensions of the gap 20 formed between the second organic layer 18 and the oxide layer 16 are described in detail in FIG. 1A.

In some embodiments, the second organic layer 18 may further cover a part of the sidewall S1 of the metal grid 14, and at least a part of the sidewall S1 of the metal grid 14 is exposed from the second organic layer 18.

Next, color filters, such as red, green or blue color filter (not shown), are formed on the substrate 20 between the plurality of metal grids 14 and between the plurality of patterned second organic layers 18.

Therefore, the optical element 10 having the plurality of metal grids 14 and the plurality of patterned second organic layers 18 formed on the plurality of metal grids 14 is formed.

Referring to FIGS. 5A-5G, in accordance with one embodiment of the invention, a method for fabricating the optical element 10 of FIG. 1 is provided. FIGS. 5A-5G show cross-sectional views of the method for fabricating the optical element 10.

Figure 5A:
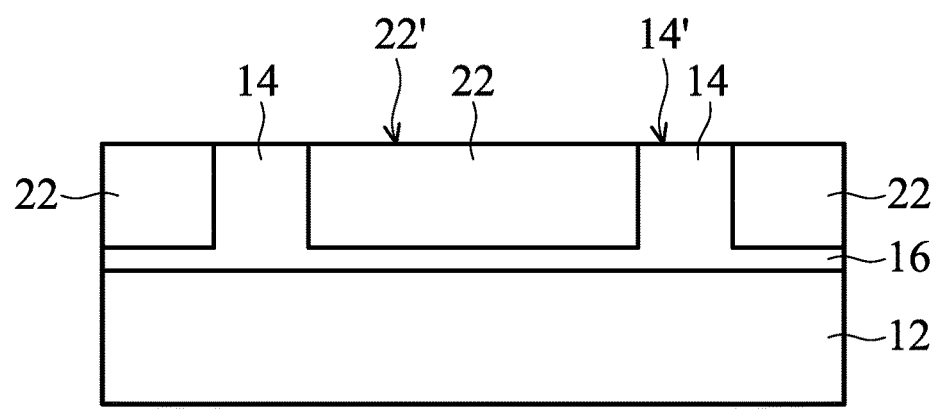
FIGS. 5A-5G are cross-sectional views of a method for fabricating an optical element in accordance with one embodiment of the invention.

Referring to FIG. 5A, a substrate 12 is provided. A plurality of metal grids 14 are formed on the substrate 12. An oxide layer 16 is formed on the substrate 12 between the plurality of metal grids 14. A first organic layer 22 is formed on the substrate 12 between the plurality of metal grids 14.

In some embodiments, the top surface 22' of the first organic layer 22 may be equal to or lower than the top surface 14' of the metal grid 14.

In some embodiments, the first organic layer 22 may comprise any suitable organic material with a refractive index (Re) which is in a range from about 1.4 to about 1.55.

Figure 5B:
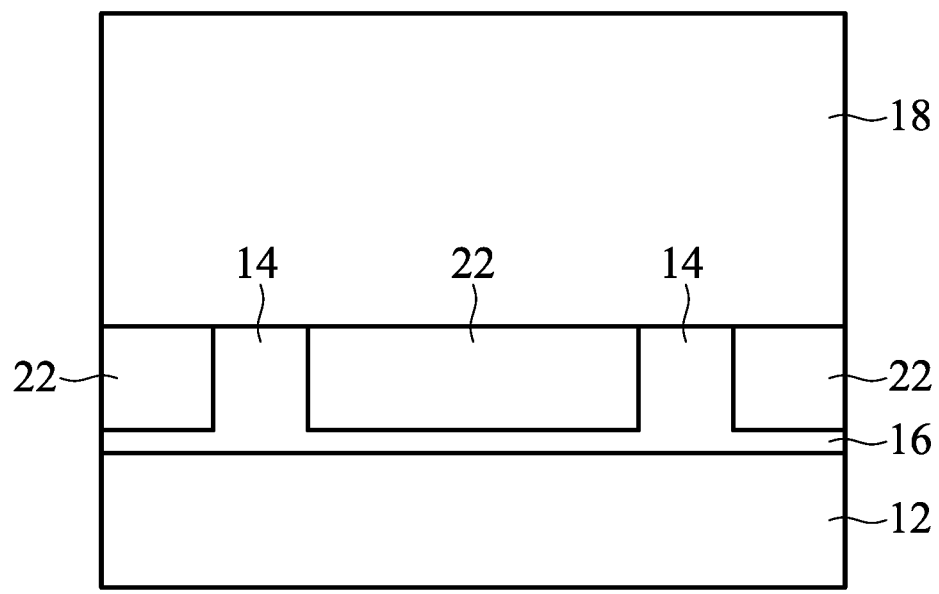

Next, referring to FIG. 5B, a second organic layer 18 is formed on the first organic layer 22 and the plurality of metal grids 14.

In some embodiments, the second organic layer 18 may comprise any suitable low-refractive-index organic materials with a refractive index which is in a range from about 1.2 to about 1.45.

In some embodiments, the second organic layer 18 may further comprise inorganic material such as titanium dioxide.

In some embodiments, the material of the second organic layer 18 and the first organic layer 22 may be the same or different.

Figure 5C:
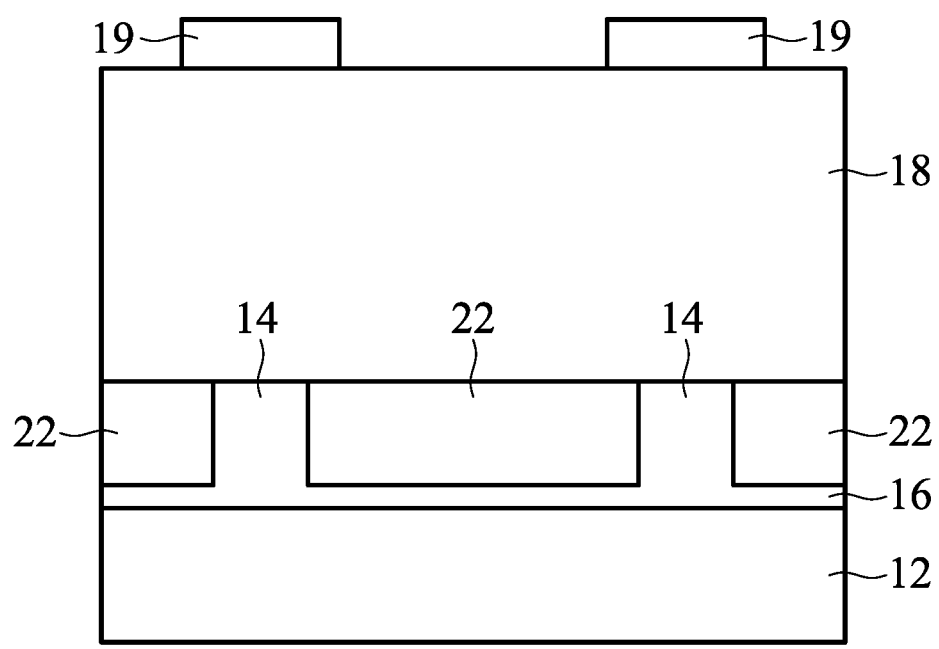

Next, referring to FIG. 5C, a patterned mask layer 19 is formed on the second organic layer 18 to define a subsequently formed wave-guiding structure.

Figure 5D:
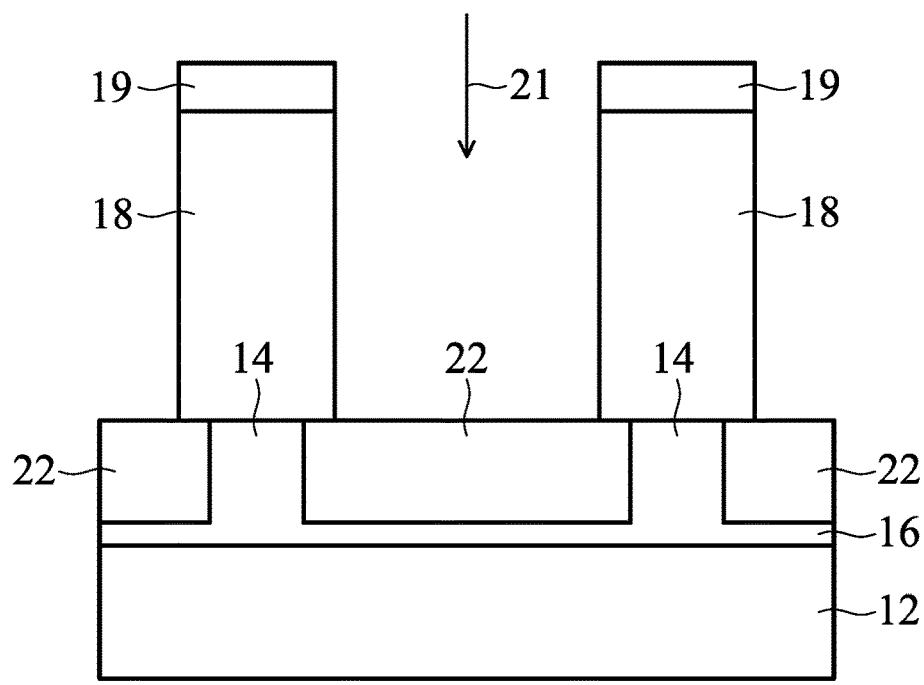

Next, referring to FIG. 5D, the second organic layer 18 is etched by a first etching process 21 using the patterned mask layer 19 as a mask to form a patterned second organic layer 18 (i.e. a wave-guiding structure).

In some embodiments, the etching gas of the first etching process 21 may be haloalkyl gas such as CF4, CHF3 or CH2F2.

In some embodiments, the second organic layer 18 is etched until the first organic layer 22 is exposed by optimally controlling the conditions, such as gas type, etching time, flow rate and etch selectivity, of the first etching process 21.

Figure 5E:
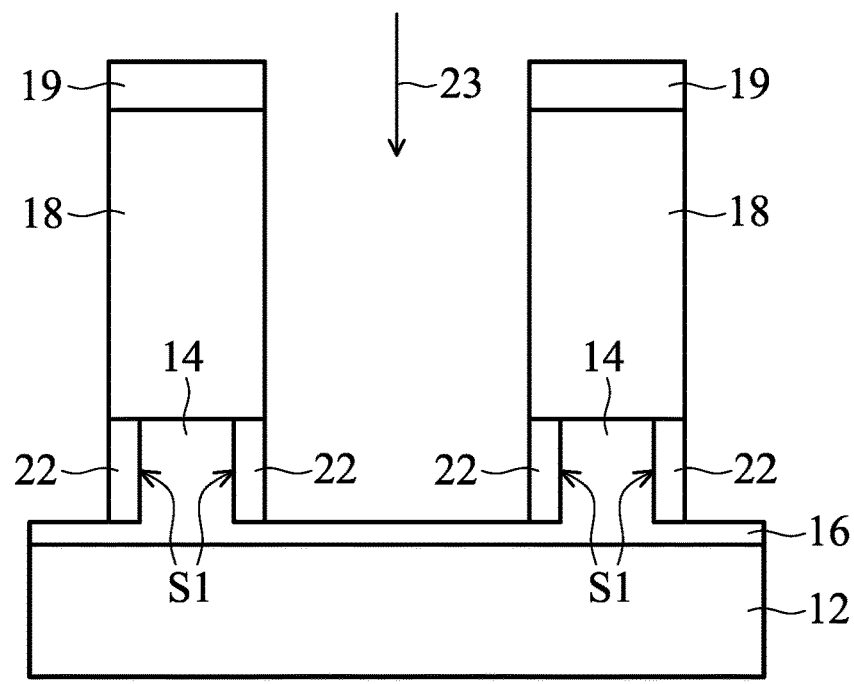

Next, referring to FIG. 5E, the first organic layer 22 is etched by a second etching process 23 using the patterned mask layer 19 as a mask. After the second etching process 23, a part of the first organic layer 22 is left on the sidewalls S1 of the plurality of metal grids 14.

In some embodiments, the etching gas of the second etching process 23 may be oxygen, carbon dioxide or nitrogen.

In some embodiments, the first organic layer 22 is etched to leave a part of the first organic layer 22 on the sidewalls S1 of the plurality of metal grids 14 by optimally controlling the conditions, such as gas type, etching time, flow rate and etch selectivity, of the second etching process 23.

In some embodiments, the dimensions of the first organic layer 22 which is left between the second organic layer 18 and the oxide layer 16 and on the sidewall S1 of the metal grid 14 are described in detail in FIG. 2.

In some embodiments, the second organic layer 18 may further cover a part of the sidewall S1 of the metal grid 14, and at least a part of the first organic layer 22 is left between the second organic layer 18 and the oxide layer 16 and on the sidewall S1 of the metal grid 14.

Figure 5F:
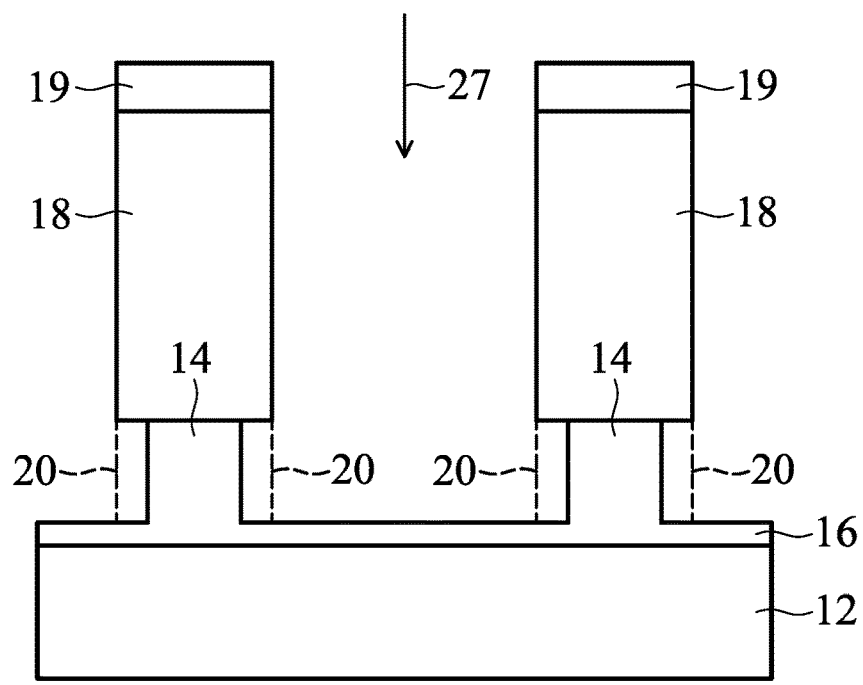

Next, referring to FIG. 5F, the first organic layer 22 left on the sidewalls S1 of the plurality of metal grids 14 is removed by a third etching process 27 using the patterned mask layer 19 as a mask, and a gap 20 is formed between the second organic layer 18 and the oxide layer 16.

In some embodiments, the etching gas of the third etching process 27 may be oxygen, carbon dioxide or nitrogen.

In some embodiments, the first organic layer 22 left on the sidewalls S1 of the plurality of metal grids 14 is etched to form the gap 20 between the second organic layer 18 and the oxide layer 16 by optimally controlling the conditions, such as gas type, etching time, flow rate and etch selectivity, of the third etching process 27.

Figure 5G:
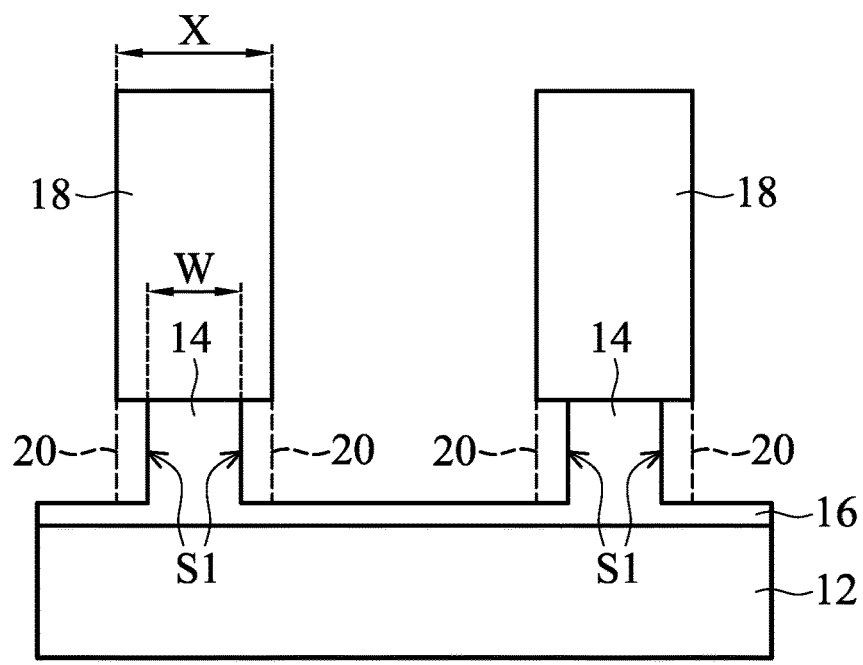

Next, referring to FIG. 5G, the patterned mask layer 19 is removed using any suitable method.

In some embodiments, the width X of the second organic layer 18 is greater than the width W of the metal grid 14.

The dimensions of the gap 20 formed between the second organic layer 18 and the oxide layer 16 are described in detail in FIG. 1A.

In some embodiments, the second organic layer 18 may further cover a part of the sidewall S1 of the metal grid 14, and at least a part of the sidewall S1 of the metal grid 14 is exposed from the second organic layer 18.

Next, color filters, such as red, green or blue color filter (not shown), are formed on the substrate 20 between the plurality of metal grids 14 and between the plurality of patterned second organic layers 18.

Therefore, the optical element 10 having the plurality of metal grids 14 and the plurality of patterned second organic layers 18 formed on the plurality of metal grids 14 is formed.

Referring to FIGS. 6A-6G, in accordance with one embodiment of the invention, a method for fabricating the optical element 10 of FIG. 1 is provided. FIGS. 6A-6G show cross-sectional views of the method for fabricating the optical element 10.

Figure 6A:
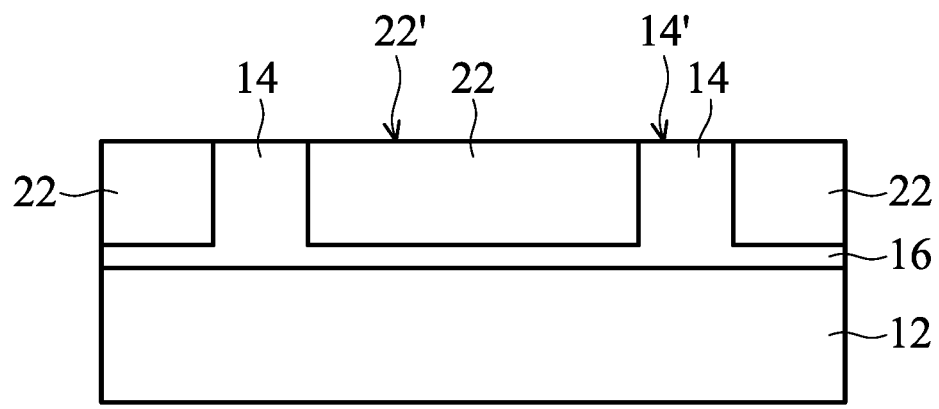
FIGS. 6A-6G are cross-sectional views of a method for fabricating an optical element in accordance with one embodiment of the invention.

Referring to FIG. 6A, a substrate 12 is provided. A plurality of metal grids 14 are formed on the substrate 12. An oxide layer 16 is formed on the substrate 12 between the plurality of metal grids 14. A first organic layer 22 is formed on the substrate 12 between the plurality of metal grids 14.

In some embodiments, the top surface 22' of the first organic layer 22 may be equal to or lower than the top surface 14' of the metal grid 14.

In some embodiments, the first organic layer 22 may comprise any suitable organic material with a refractive index (Re) which is in a range from about 1.4 to about 1.55.

Figure 6B:
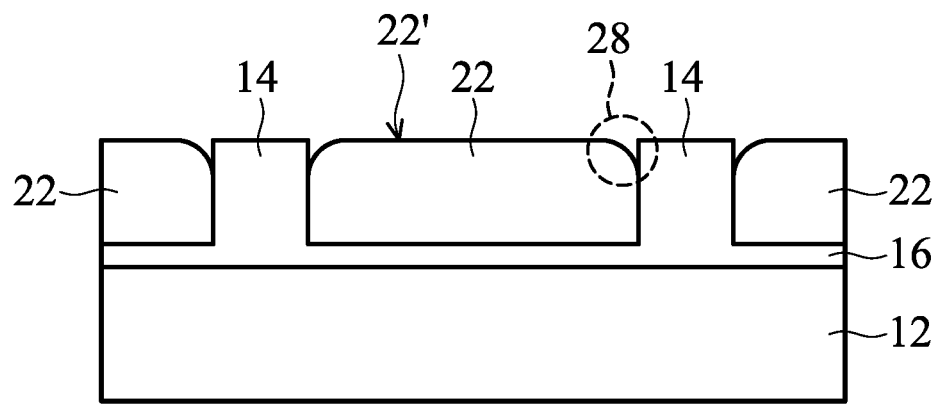

Next, referring to FIG. 6B, the first organic layer 22 between the plurality of metal grids 14 is patterned by, for example, a reflow process to flatten the top surface 22' of the first organic layer 22, and then a gap 28 is formed between the first organic layer 22 and the metal grid 14.

Figure 6C:
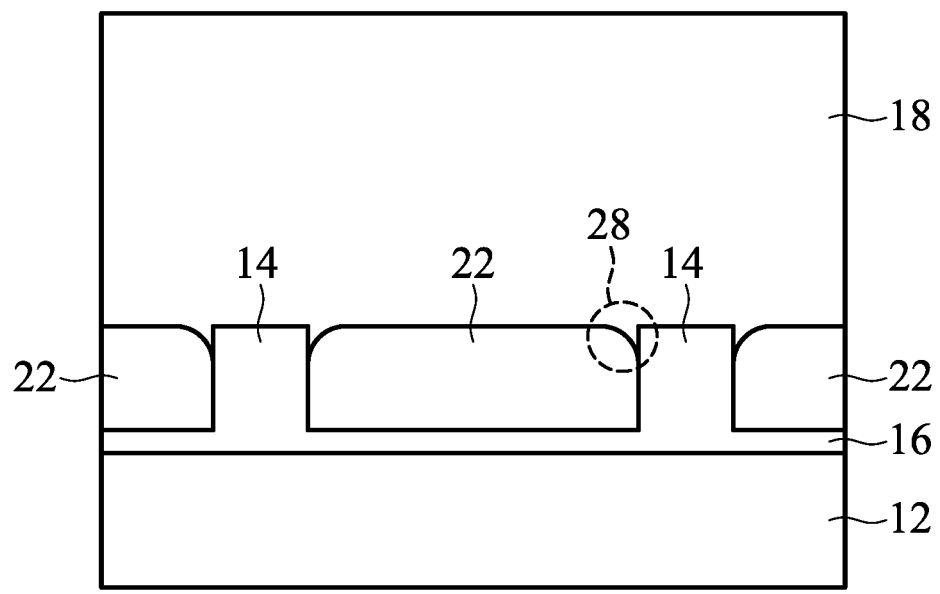

Next, referring to FIG. 6C, a second organic layer 18 is formed on the first organic layer 22 and the plurality of metal grids 14 and filled into the gap 28 between the first organic layer 22 and the metal grid 14.

In some embodiments, the second organic layer 18 may comprise any suitable low-refractive-index organic materials with a refractive index which is in a range from about 1.2 to about 1.45.

In some embodiments, the second organic layer 18 may further comprise inorganic material such as titanium dioxide.

In some embodiments, the material of the second organic layer 18 and the first organic layer 22 may be the same or different.

Figure 6D:
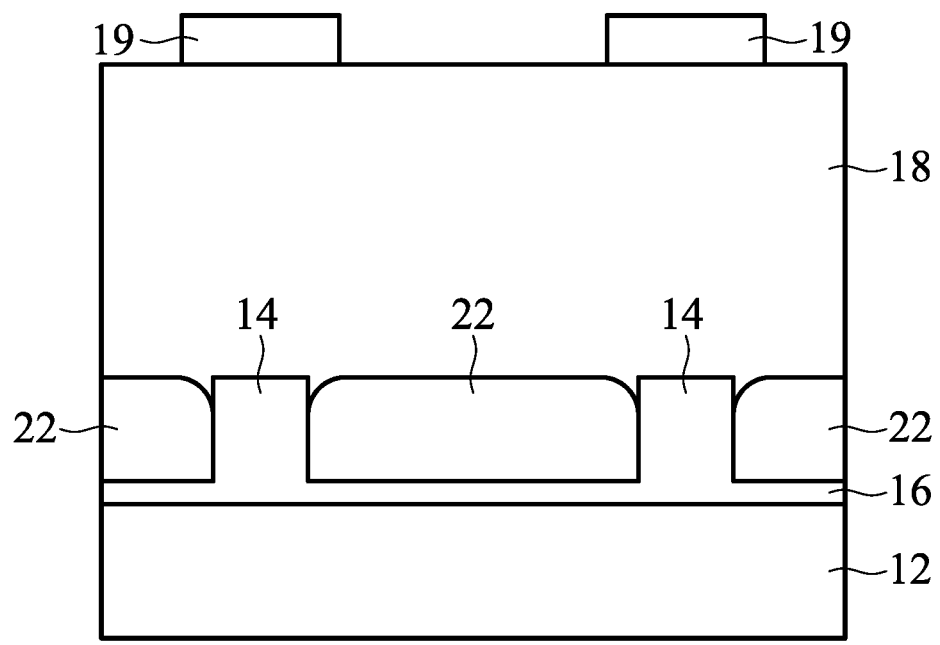

Next, referring to FIG. 6D, a patterned mask layer 19 is formed on the second organic layer 18 to define a subsequently formed wave-guiding structure.

Figure 6E:
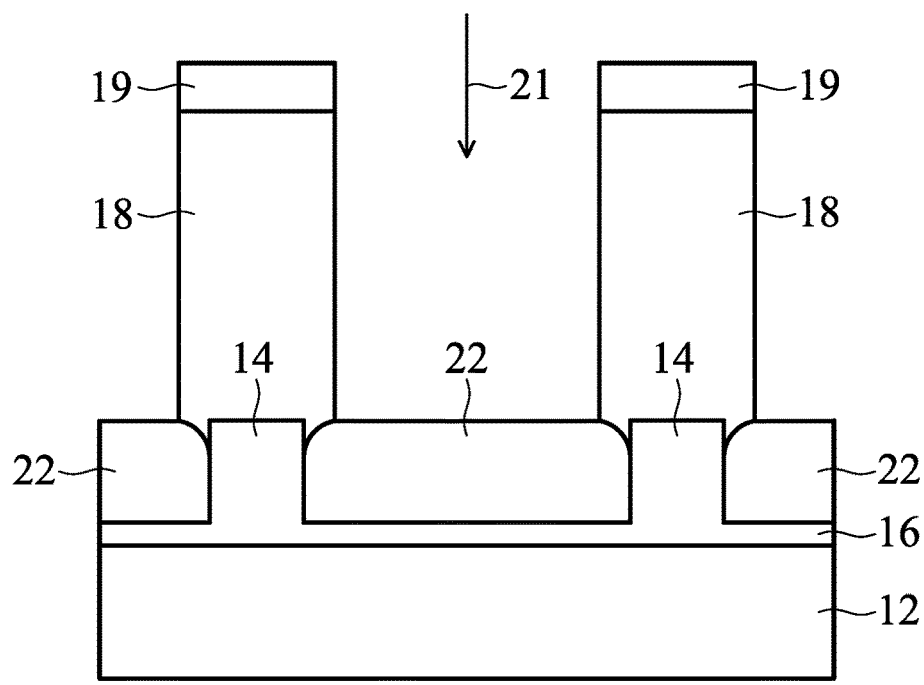

Next, referring to FIG. 6E, the second organic layer 18 is etched by a first etching process 21 using the patterned mask layer 19 as a mask to form a patterned second organic layer 18 (i.e. a wave-guiding structure).

In some embodiments, the etching gas of the first etching process 21 may be haloalkyl gas such as CF4, CHF3 or CH2F2.

In some embodiments, the second organic layer 18 is etched until the first organic layer 22 is exposed by optimally controlling the conditions, such as gas type, etching time, flow rate and etch selectivity, of the first etching process 21.

Figure 6F:
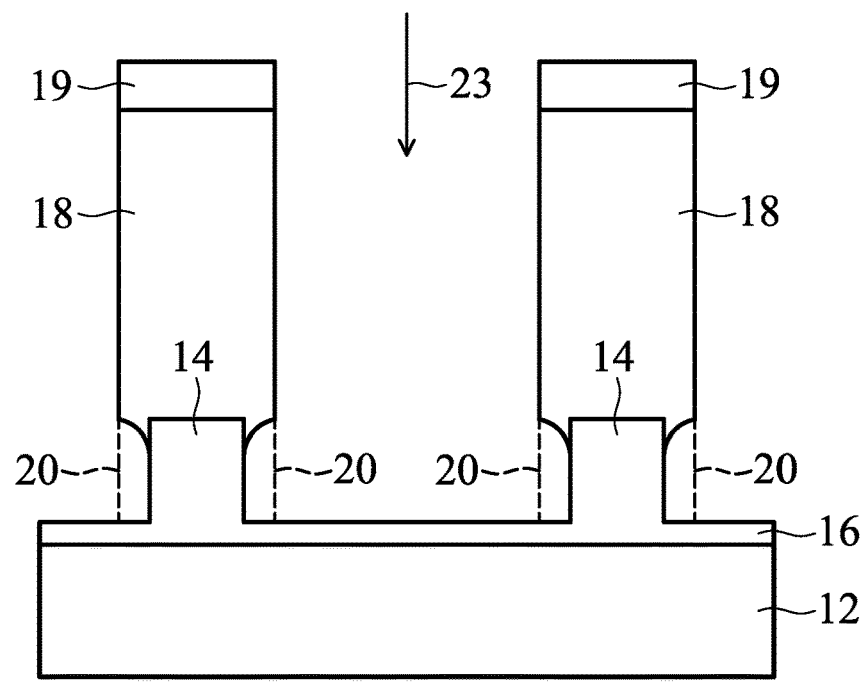

Next, referring to FIG. 6F, the first organic layer 22 is etched by a second etching process 23 using the patterned mask layer 19 as a mask, and a gap 20 is formed between the second organic layer 18 and the oxide layer 16.

In some embodiments, the etching gas of the second etching process 23 may be oxygen, carbon dioxide or nitrogen.

In some embodiments, the first organic layer 22 is etched until the gap 20 is formed between the second organic layer 18 and the oxide layer 16 by optimally controlling the conditions, such as gas type, etching time, flow rate and etch selectivity, of the second etching process 23.

Figure 6G:
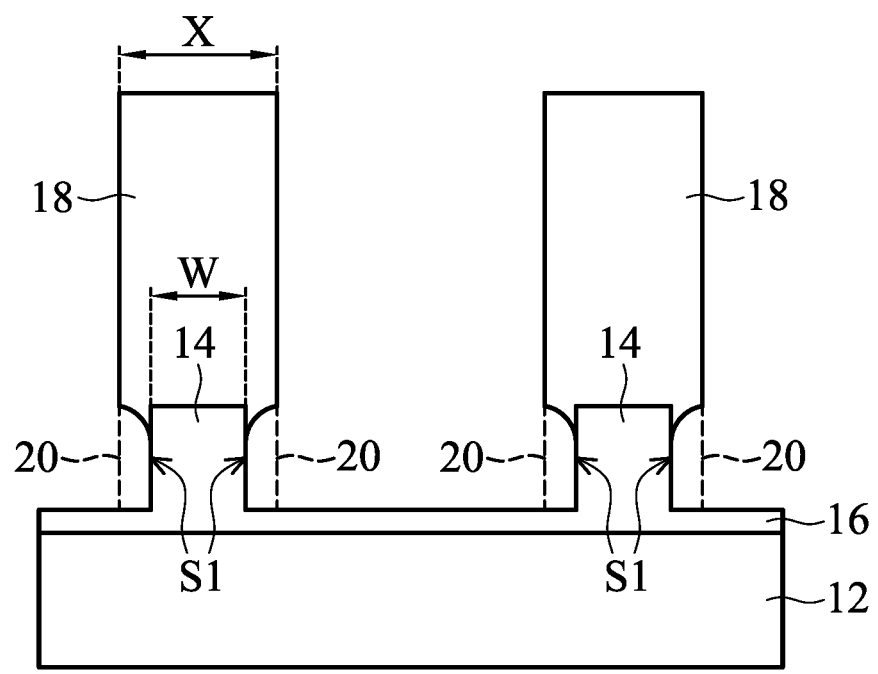

Next, referring to FIG. 6G, the patterned mask layer 19 is removed using any suitable method.

In some embodiments, the width X of the second organic layer 18 is greater than the width W of the metal grid 14.

The dimensions of the gap 20 formed between the second organic layer 18 and the oxide layer 16 are described in detail in FIG. 1A.

In some embodiments, the second organic layer 18 may further cover a part of the sidewall S1 of the metal grid 14, and at least a part of the sidewall S1 of the metal grid 14 is exposed from the second organic layer 18.

Next, color filters, such as red, green or blue color filter (not shown), are formed on the substrate 20 between the plurality of metal grids 14 and between the plurality of patterned second organic layers 18.

Therefore, the optical element 10 having the plurality of metal grids 14 and the plurality of patterned second organic layers 18 formed on the plurality of metal grids 14 is formed.

In the present invention, it is not required that a microlens (ML) structure be disposed over the color filters. Light is conducted into photodiode (PD) areas through a wave-guiding element which is fabricated on metal grids. The present invention provides a two-step process for fabricating a wave-guiding structure. A first organic layer (refractive index: about 1.4 to about 1.55) is first formed between the metal grids. The first organic layer is used as a buffer layer for a subsequent etching process. A second organic layer (refractive index: about 1.2 to about 1.45) is then formed on the first organic layer and the metal grids. The second organic layer is used to form the wave-guiding element. When a first etching process is performed using, for example, haloalkyl gas as an etching gas, the second organic layer is etched but the first organic layer is left. The remaining first organic layer is then removed by a second etching process using, for example, oxygen (which has a strong ability for lateral etching) as an etching gas, or the remaining first organic layer is removed by soaking it in solvent. Using such a technique can effectively prevent damage to the oxide layer on the substrate during the etching process.

In addition, in some embodiments, before the second organic layer is formed, the first organic layer is patterned by, for example, a reflow process to flatten the top surface of the first organic layer, which avoids the first organic layer remaining on the metal grid, improving wave-guiding effect. Furthermore, the optical performance, for example the QE profile of the present structure designs (e.g. forming a gap with specific dimensions underneath the wave-guiding element and located on both sides of the metal grid; filling the buffer layer into the gap) is no worse than the conventional wave-guiding structure without an ML structure.

While the invention has been described by way of example and in terms of preferred embodiment, it is to be understood that the invention is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating an optical element, comprising:
   providing a substrate;
   forming a plurality of metal grids having sidewalls on the substrate;
   forming a first organic layer on the substrate between the plurality of metal grids;
   forming a second organic layer on the first organic layer and the plurality of metal grids;
   etching the second organic layer and the first organic layer to leave the plurality of metal grids and a plurality of patterned second organic layers on the plurality of metal grids; and
   forming color filters on the substrate between the plurality of metal grids and between the plurality of patterned second organic layers.

2. The method for fabricating an optical element as claimed in claim 1, wherein the second organic layer is etched by a first etching process.

3. The method for fabricating an optical element as claimed in claim 2, wherein the first etching process uses haloalkyl gas as an etching gas.

4. The method for fabricating an optical element as claimed in claim 2, wherein the first organic layer is etched by a second etching process.

5. The method for fabricating an optical element as claimed in claim 4, wherein the second etching process uses oxygen, carbon dioxide or nitrogen as an etching gas.

6. The method for fabricating an optical element as claimed in claim 4, wherein a part of the first organic layer is left on the sidewalls of the plurality of metal grids after the second etching process.

7. The method for fabricating an optical element as claimed in claim 6, wherein the first organic layer left on the sidewalls of the plurality of metal grids is removed by soaking in solvent or a third etching process.

8. The method for fabricating an optical element as claimed in claim 7, wherein the third etching process uses oxygen, carbon dioxide or nitrogen as an etching gas.

9. The method for fabricating an optical element as claimed in claim 1, wherein the second organic layer and the first organic layer are etched by a fourth etching process using haloalkyl gas as an etching gas to leave a part of the first organic layer between the plurality of metal grids.

10. The method for fabricating an optical element as claimed in claim 9, wherein the first organic layer between the plurality of metal grids is removed by soaking in solvent.

11. The method for fabricating an optical element as claimed in claim 1, further comprising patterning the first organic layer before the second organic layer is formed.

12. The method for fabricating an optical element as claimed in claim 1, wherein the first organic layer has a refractive index which is in a range from about 1.4 to about 1.55.

13. The method for fabricating an optical element as claimed in claim 1, wherein the second organic layer has a refractive index which is in a range from about 1.2 to about 1.45.

* * * * *